United States Patent [19]

Mooney

[11] Patent Number: 4,578,612
[45] Date of Patent: Mar. 25, 1986

[54] SHOCK ABSORBER AND SPACER FOR QUARTZ CRYSTALS

[75] Inventor: Charles W. Mooney, Lake Worth, Fla.

[73] Assignee: Motorola, Inc., Del.

[21] Appl. No.: 650,484

[22] Filed: Sep. 14, 1984

[51] Int. Cl.$^4$ ............................................. H01L 41/08
[52] U.S. Cl. .............................. 310/348; 174/138 G; 310/345
[58] Field of Search ............... 310/311, 326, 344, 348, 310/351–356, 345; 174/138 G, 50.51; 361/403; 220/400–403, DIG. 21

[56] References Cited

U.S. PATENT DOCUMENTS

| | | | |
|---|---|---|---|
| 3,541,230 | 11/1970 | Kramer | 174/138 G |
| 3,612,749 | 10/1971 | Grube, Jr. | 310/348 X |
| 3,684,817 | 8/1972 | Card, Jr. | 174/138 G X |
| 3,697,789 | 10/1972 | Kato | 310/345 X |
| 3,962,719 | 6/1976 | Pfaff | 174/138 G X |
| 4,148,183 | 4/1979 | Murakami | 310/345 X |
| 4,219,756 | 8/1980 | Nishida et al. | 310/348 |
| 4,367,371 | 1/1983 | Nakamura | 174/138 G X |

FOREIGN PATENT DOCUMENTS 0154987 12/1979 Japan .................................. 310/345

OTHER PUBLICATIONS

Motorola Pageboy II (TM) Paging Receiver.

*Primary Examiner*—Mark O. Budd
*Attorney, Agent, or Firm*—Mark P. Kahler; Joseph T. Downey; Daniel K. Nichols

[57] ABSTRACT

A shock isolator for a fragile crystal device (20) includes a headed vacuum molded Teflon sheath (10) having rib springs (12) molded on the surface (11) for absorbing the shock of impact with nearby components. An integral spacer (14) is provided and coupled to the shock isolator proper by a living hinge (15). A plurality of keyhole-shaped slots (18) are provided in the spacer for engagement with the crystal leads (22) when the spacer is folded under into its operative position.

9 Claims, 4 Drawing Figures

SHOCK ABSORBER AND SPACER FOR QUARTZ CRYSTALS

BACKGROUND OF THE INVENTION

1. Field of the Invention

This invention relates generally to the field of shock protection for fragile quartz crystals and the like. More particularly, this invention relates to a shock absorbing mechanism and spacer for protecting quartz crystals from impact with the walls of its enclosure and secondary impact against surrounding components.

2. Background

Quartz crystals are frequently used in electronic radio equipment such as two-way radios, pagers and the like as high stability frequency determining elements. They are also used in such radio equipment as filtering elements due to their very high "Q" and therefore high selectivity.

Unfortunately, it has long been recognized that such crystal devices are usually the most fragile components in the radio equipment. This presents special problems when the radio equipment is used in an environment which makes it especially susceptible to high mechanical shock such as police radios or pagers which may be subject to frequent drops. In these environments it is not unusual for crystal devices to shatter or crack when presented with excess mechanical shock. The problem is compounded by the rapid miniaturization of such equipment making it subject to higher impact velocities when carelessly tossed about.

In order to enhance the reliability of such electronic equipment, it is clearly necessary to provide better mechanical shock protection for such crystal devices. Crystal devices which can consistently withstand shocks of approximately 20,000 to 30,0" nes the force of gravity (20,000 to 30,000 G's) a. ⁓r for approximately 0.3 milliseconds are needed ₁ ..asure the reliability of such electronic devices at present and in the future even greater shock performance will be necessary. At present, shocks in excess of this limit are absorbed by deformation and damage to the plastic enclosures typically used on such equipment.

A number of solutions to this problem have been proposed and have met with varying degrees of success. Unfortunately, none of these proposals have been able to reliably and consistently enable such crystal devices to withstand mechanical shocks in excess of approximately 15,000 G's. Such proposals have included simply coating the inner surface of a crystal enclosure with plastic to absorb shock and inserting short sections of plastic tubing or plastic strips inside the crystal enclosure to absorb shock. While such techniques provide some degree of improvement in the shock levels crystal devices can withstand without them (typically approximately 2000 to 3000 G's unprotected), further improvement is required to achieve acceptable levels of reliability.

In order to further increase the crystal devices ability to survive mechanical shock, thick foam or plastic shock cushions are often placed over the exterior of the crystal enclosure to help absorb the shock of impact with surrounding components. These provide some degree of protection by absorbing a portion of the shock with the compressive spring properties of the material itself, but are space consuming and only partially effective since the spring rate is only controllable by virtue of selection of type and thickness of material.

Further enhancement may be obtained by spacing the crystal device above its circuit board with a resiliently spacer to enable the device's electrical leads to absorb a portion of the shock. This technique has the added advantage of reducing the incidence of leads actually being pulled from the crystal device. Unfortunately, use of exterior shock cushions in conjunction with spacers greatly increases the handling cost of inserting the crystal device into the circuit board and is collectively very space inefficient.

SUMMARY OF THE INVENTION

It is an object of the present invention to provide an improved exterior shock absorber for fragile crystal devices.

It is another object of the present invention to provide a crystal shock absorber which will allow crystal devices to reliably survive high shock levels while occupying a minimal volume.

It is another object of the present invention to provide an exterior crystal shock absorber which overcomes the deficiencies of other exterior crystal shock absorbers.

It is a further object of the present invention to provide a shock absorbing system for crystal devices which does not interfere with the normal operation of the crystal.

It is yet a further object of the present invention to provide an exterior shock absorbing mechanism with an integral spacer to facilitate ease of handling and provide a controllable spring rate mechanism.

These and other objects and advantages of the present invention will become apparent to those skilled in the art upon consideration of the following description of the invention.

In one embodiment of the present invention, a shock isolator having an integral spacer for use in conjunction with quartz crystal enclosures or the like having electrical leads includes a body portion having a shape suitable for substantially covering portions of the crystal enclosure. A springing mechanism is coupled to the body portion, for providing isolation to the crystal enclosure against the shock of impact with nearby structures. A spacer for spacing said crystal enclosure away from a circuit board by a predetermined distance is attached to a hinging mechanism for attaching the spacer to the body portion in a manner which allows the spacer to be pivoted to a first position to facilitate easy attachment of the crystal enclosure to the body portion and pivoted into an operative position for spacing the crystal from the circuit board. A retention device is used for retaining the spacer in the operative position.

The features of the invention believed to be novel are set forth with particularity in the appended claims. The invention itself, however, both as to organization and method of operation, together with further objects and advantages thereof, may be best understood by reference to the following description taken in conjunction with the accompanying drawings.

DESCRIPTION OF THE PREFERRED EMBODIMENT

Figure 1:
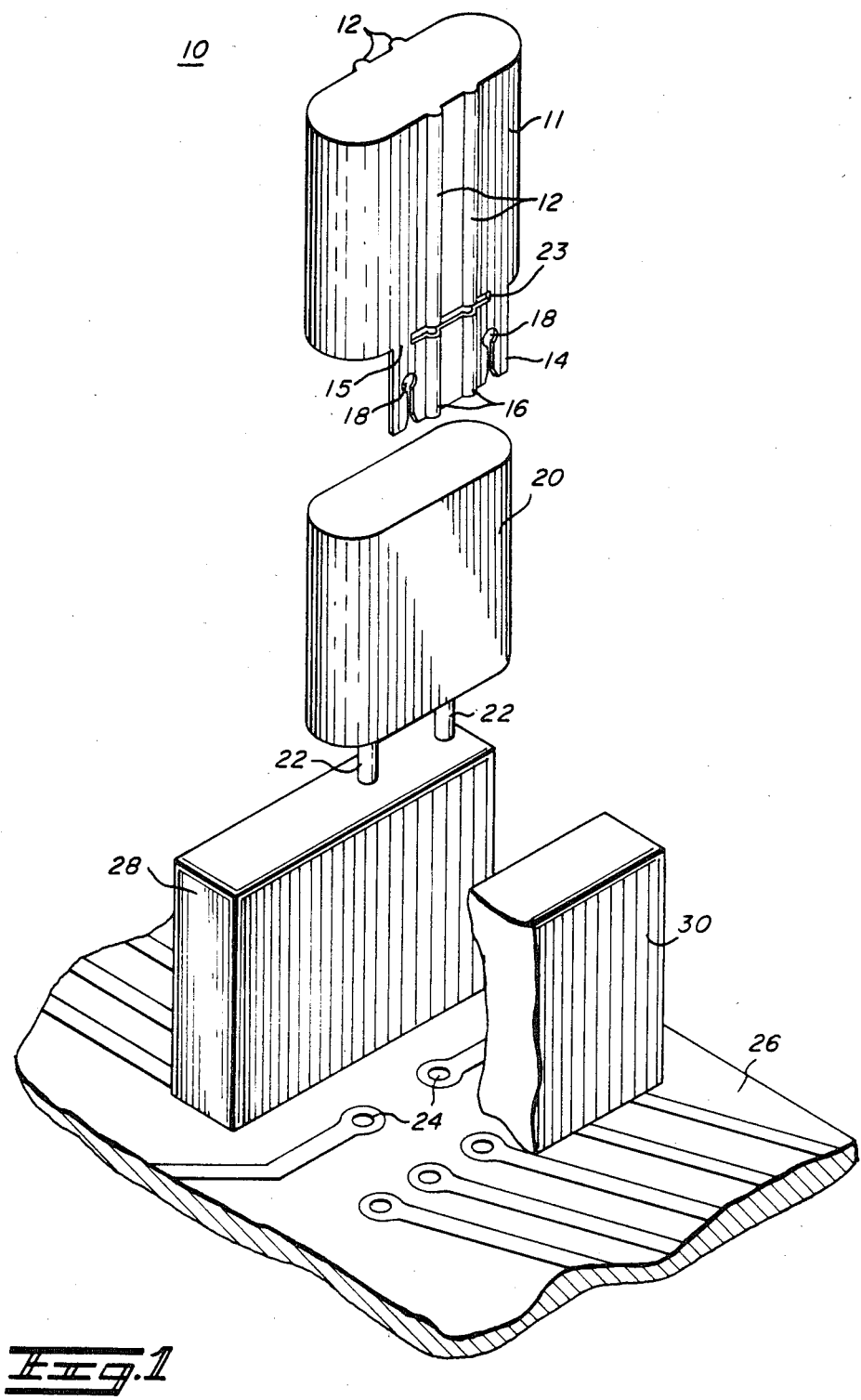
FIG. 1 shows an exploded view of the present invention including a crystal device and printed circuit board.
Figure 2:
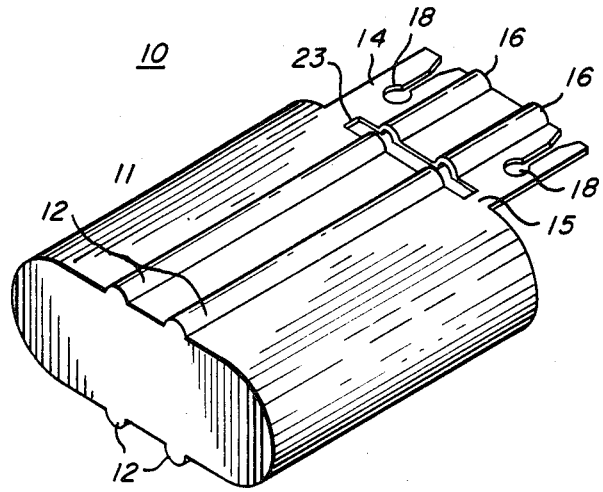
FIG. 2 shows a perspective view of the combined spacer and shock absorber of the present invention.

Turning now to FIG. 1 the shock isolator of the present invention is shown generally as 10. Shock isolator 10 may be better understood by viewing FIG. 1 in conjunction with FIG. 2. Shock isolator 10 is preferrably made of vacuum formed Polytetrafluorethylene (Teflon, trademark of Dupont) film having a thickness of approximately 0.004 to 0.005 inches. Film such as Dupont PFA 350 is acceptable in the present application. A plurality of rib springs 12 are formed in on the surface of the shock isolator's body portion 11 to form springs for absorbing the shock of impact with adjacent electrical components.

Shock isolator 10 preferably includes a hinged flap-like spacer 14 connected to body portion 11 by a living hinge 15 at its lower end allowing two normally independent parts to be made in a single process. Spacer 14 includes spacer ribs 16 formed therein. A plurality of keyhole-like cutouts 18 are situated in the spacer 14. In use the spacer is folded or pivoted under the bottom of a crystal device 20 to its operative position such that keyhole-like cutouts 18 engage each of the electrical leads 22 of crystal device 20 thereby retaining the spacer in place. In the present embodiment, two such leads and cutouts are used but this is not to be limiting as any number of such leads may be present in various crystal devices. A thin slot 23 may be pierced at the junction of the spacer and the body portion to facilitate ease of operation of the hinge but this is n~ be limiting. Of course other arrangements fo.  ¯ig the spacer and shock isolator together and for  ыing the spacer in its operative position will occur to those skilled in the art.

The body 11 of shock isolator 10 is preferably shaped to generally conform to the shape of the body of the crystal enclosure it is intended for use with. In this manner it may be placed over the crystal enclosure in a sheath-like manner as shown. Of course when the crystal is inserted into the body portion of the shock isolator, the spacer is pivoted to an out of the way position to facilitate easy insertion. This allows the body portion 11 to act as a carrier for the rib springs. After the shock isolator is installed on the crystal device 20 and the cutouts 18 are engaged with the leads 22, leads 22 may be inserted through holes 24 of a circuit board 26 along with other electrical components such as 28 and 30. In this manner the crystal along with spacer and shock isolator are easily handled as a single package without the difficulty of handling associated with separate spacers and shock pads of the prior art.

Figure 3:
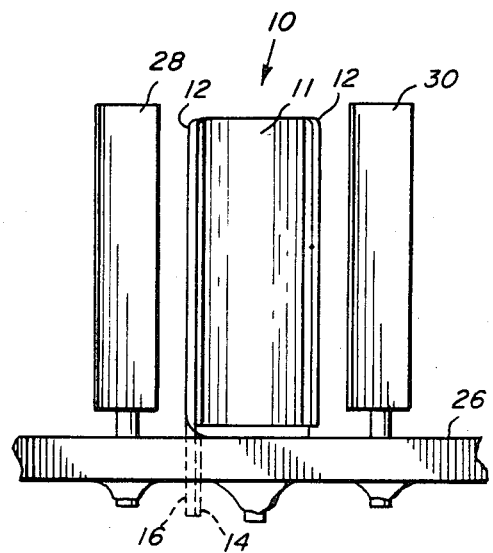
FIG. 3 shows a side view of the present invention installed on a crystal device and inserted into a circuit board.

FIG. 3 shows a side view of such assembly showing the spacer folded under and in place. When this assembly is shocked, it is possible for components 28 and 30 to impact the shock isolator's rib springs 12. Rib springs 12 are designed to have an appropriate spring rate to cushion the shock to the crystal device thereby reducing the possibility of damage to the fragile crystal blank. For an industry standard HC-18 crystal enclosure, rib springs having a semicircular cross-section with an outer diameter of 0.050 and a height of 0.025 inches above the outer surface of the body portion of the isolator are generally suitable. These dimensions are given by way of example, however, and are not to be limiting. These dimensions result in a linear spring rate of approximately 440 pounds/inch which is appropriate to cushion shocks induced by a gravity drop of approximately six feet for a typical pager or two way radio. Of course, those skilled in the art will recognize that suitable modification to the springs may be made to accommodate different crystal packages.

Spacer 14 provides spacing between the circuit board 26 and the crystal device so that the leads are also able to absorb a portion of the shock. In the present embodiment, the crystal device is spaced approximately 0.025 inches above the circuit board on two semicircular ribs of 0.050 inches diameter.

When more conventional shock isolators are utilized, approximately 0.025 inches of solid space must be allowed around all sides and the top of the crystal to assure adequate space and protection. That space is reduced to approximately 0.004 inches except for the rib areas with the preferred embodiment of the present invention. With a conventional HC-18 crystal enclosure this results in an increase in usable volume of 0.006 cubic inches around each crystal thereby enhancing the ability to miniaturize electronic devices. In addition, the shock isolation expected with the present invention is two to four times higher when compared with the prior art.

According to the present invention, this shock isolator is made by heated vacuum forming of a sheet of 0.004 to 0.005 inch thick Teflon film such as Dupont PFA 350 film. This particular dimension and type of film is suitable for the present embodiment for use with the industry standard HC-18 crystal enclosure. Other materials and dimensions may be suitable for this and other embodiments without deviation from the spirit of the invention. Since shock isolator 10 is made of a Teflon film, it may be made very thin compared with the foam or plastic shock isolators of the prior art. The film may also be molded to produce controllable springs which may be adjusted to the particular needs of the individual situation by varying the dimensions of the rib springs.

It may also be advantageous in some situations to use other geometries than that of the vertical rib springs shown by way of example. One skilled in the art will recognize many such variations within the scope of this invention.

Figure 4:
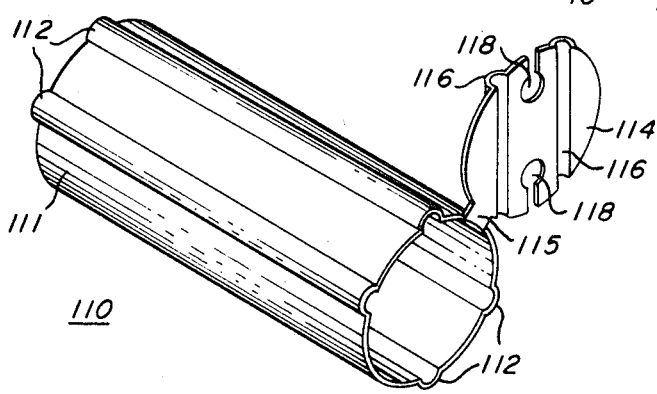
FIG. 4 shows an alternate embodiment of the present invention adapted for use in conjunction with the popular I.B.P. crystal package.

In an alternate embodiment shown in FIG. 4 the present invention may be used in conjunction with geometries of crystal packages other than conventional oval cans. In this embodiment, the I.B.P. style cylindrical package is accommodated by shock isolator 110 having a body portion 111 with rib springs 112 and spacer 114. Spacer 114 includes cutouts 118 for engagement with the crystal device's leads and a living hinge 115 attaching it to the body portion 111. A pair of spacer ribs 116 provide spacing of the crystal device from the corcuit board. The rib springs of the preferred embodiment are approximately 0.050 inches in diameter with a height of approximately 0.025 inches.

While the embodiments presented are specifically directed toward crystal enclosures having somewhat oval or round cross sections, it will be evident to those skilled in the art that the present invention may be readily adapted to other crystal enclosure geometries or to other fragile electronic assemblies by making suitable modifications. Suitable modifications may also be made to the spring materials and spring geometries without deviating from the scope of this invention.

Thus it is apparent that in accordance with the present invention an apparatus that fully satisfies the objectives, aims and advantages is set forth above. While the invention has been described in conjunction with specific embodiments, it is evident that many alternatives, modifications, and variations will become apparent to those skilled in the art in light of the foregoing description. Accordingly, it is intended that the present invention embrace all such alternatives, modifications and variations as fall within the spirit and broad scope of the appended claims.

What is claimed is:

1. A shock isolator having an integral spacer for use in conjunction with quartz crystal enclosures or the like having electrical leads, said shock isolator comprising:
   a body portion having a shape suitable for substantially covering portions of said crystal enclosure;
   springing means, coupled to said body portion, for providing isolation to said crystal enclosure against the shock of impact with nearby structures;
   spacing means for spacing said crystal enclosure away from a circuit board by a predetermined distance; and
   hinging means for attaching said spacing means to said body portion in a manner which allows said spacing means to be pivoted to a first position to facilitate easy attachment of said crystal enclosure to said body portion and pivoted into an operative position for spacing said crystal enclosure from said circuit board.

2. The shock isolator of claim 1 further including retention means for retaining said spacing means in said operative position.

3. The shock isolator of claim 1 wherein said springing means includes a plurality of rib springs.

4. The shock isolator of claim 1 wherein said hinging means includes a living hinge.

5. The shock isolator of claim 2 wherein said retention means includes means for engaging electrical leads of said crystal device.

6. The shock isolator of claim 1 wherein said shock isolator is made of heated vacuum formed Teflon.

7. The shock isolator of claim 1 further including a quartz crystal enclosure containing a quartz crystal device disposed within said body portion.

8. The shock isolator of claim 7 wherein said crystal enclosure includes a plurality of electrical leads and further including a circuit board soldered to said leads.

9. A shock isolator having an integral spacer for use in conjunction with an electronic component having electrical leads, said shock isolator comprising:
   a body portion having a shape suitable for substantially covering portions of said electronic component;
   springing means, coupled to said body portion, for providing isolation to said electronic component against the shock of impact with nearby structures;
   spacing means for spacing said electronic component away from a circuit board by a predetermined distance; and
   hinging means for attaching said spacing means to said body portion in a manner which allows said spacing means to be pivoted to a first position to facilitate easy attachment of said electronic component to said body portion and pivoted into an operative position for spacing said electronic component from said circuit board.

* * * * *